United States Patent [19]

Sugibayashi et al.

[11] Patent Number: 5,329,168
[45] Date of Patent: Jul. 12, 1994

[54] SEMICONDUCTOR INTEGRATED CIRCUIT DEVICE EQUIPPED WITH SUBSTRATE BIASING SYSTEM SELECTIVELY POWERED FROM INTERNAL AND EXTERNAL POWER SOURCES

[75] Inventors: Tadahiko Sugibayashi; Yasuji Koshikawa; Takahiro Hara, all of Tokyo, Japan

[73] Assignee: NEC Corporation, Tokyo, Japan

[21] Appl. No.: 996,142

[22] Filed: Dec. 23, 1992

[30] Foreign Application Priority Data

Dec. 27, 1991 [JP] Japan ............................ 3-359816

[51] Int. Cl.⁵ .................. H03K 3/01; H01L 25/00; G11C 7/00
[52] U.S. Cl. ........................ 307/296.1; 307/296.2; 307/296.6; 307/303.1; 307/303.2; 307/304; 365/189.09; 365/226
[58] Field of Search ............ 307/296.1, 296.2, 296.6, 307/303.1, 303.2, 304; 365/189.09, 226, 229

[56] References Cited

U.S. PATENT DOCUMENTS

| | | | |
|---|---|---|---|
| 4,616,346 | 10/1986 | Nakaizumi et al. | 365/229 |
| 4,710,905 | 12/1987 | Uchida | 365/229 |
| 4,961,167 | 10/1990 | Kumanoya et al. | 365/189.09 |
| 4,994,689 | 2/1991 | Kikuda et al. | 307/296.2 |
| 5,109,505 | 4/1992 | Kihara | 365/229 |
| 5,191,235 | 3/1993 | Hara | 307/296.2 |
| 5,204,840 | 4/1993 | Mazur | 365/229 |

Primary Examiner—Timothy P. Callahan
Assistant Examiner—Trong Phan
Attorney, Agent, or Firm—Sughrue, Mion, Zinn, Macpeak & Seas

[57] ABSTRACT

A dynamic random access memory device negatively biases the semiconductor substrate, and a substrate bias system incorporated therein produces a negative bias voltage from an external power voltage level for accelerating the negative biassing operation before an internal power voltage is sufficiently developed by an internal step-down circuit incorporated therein; however, after the development, the substrate bias system produces the negative bias voltage from the internal power voltage so as to be less affectable by fluctuation of the external power voltage level.

12 Claims, 9 Drawing Sheets

SEMICONDUCTOR INTEGRATED CIRCUIT DEVICE EQUIPPED WITH SUBSTRATE BIASING SYSTEM SELECTIVELY POWERED FROM INTERNAL AND EXTERNAL POWER SOURCES

FIELD OF THE INVENTION

This invention relates to a semiconductor integrated circuit device and, more particularly, to a semiconductor integrated circuit device equipped with a substrate biasing system selectively powered from an internal power source and an external power source.

DESCRIPTION OF THE RELATED ART

An ultra large scale integration such as a 16 megabit dynamic random access memory device is usually equipped with an internal step-down circuit for the miniaturized component field effect transistors, and an external power voltage of 5 volts is stepped down to 3.3 volts before distributing to the miniaturized component field effect transistors. A substrate bias system is incorporated in such an ultra large scale dynamic random access memory device, and negatively biases the semiconductor substrate. While the dynamic random access memory device remains active, the semiconductor substrate is kept at $-2$ volts.

FIG. 1 shows a typical example of the substrate bias system incorporated in the prior art dynamic random access memory device, and the substrate bias system comprises a voltage monitoring circuit 1, and a bias voltage producing circuit 2. A feedback loop is formed between the voltage monitoring circuit 1 and the bias voltage producing circuit 2, and the bias voltage is regulated to $-2$ volts. Namely, the voltage monitoring circuit 1 monitors the bias voltage level at the output node of the bias voltage producing circuit 2, and produces a control signal CTL1 indicative of the outside of a target range. The bias voltage producing circuit 2 is responsive to the control signal CTL, and forcibly biases the semiconductor substrate at $-2$ volts. The dynamic random access memory device is equipped with an internal step-down circuit 3, and the internal step-down circuit 3 produces an internal power voltage Vint of 3.3 volts from an external power voltage Vcc of 5.0 volts. The internal power voltage Vint is distributed to predetermined component circuits, and both of the voltage monitoring circuit 1 and the bias voltage producing circuit 2 are powered by the internal step-down circuit 3. The reason why the substrate bias system is powered by the internal step-down circuit 3 is that the internal power voltage Vint is stable rather than the external power voltage Vcc.

The voltage monitoring circuit 1 is arranged as shown in FIG. 2, and comprises a series combination of a p-channel enhancement type field effect transistor 1a and an n-channel enhancement type field effect transistor 1b coupled between the external power voltage line Vcc and the semiconductor substrate, and inverters 1c coupled in series between the common drain node N1 and a control node N2 where the control signal CTL1 takes place.

The p-channel enhancement type field effect transistor 1a and the n-channel enhancement type field effect transistor 1b have respective gate electrodes both grounded, and the channel conductance of the n-channel enhancement type field effect transistor 1b is variable depending upon the voltage level in the semiconductor substrate. In detail, the channel conductance of the p-channel enhancement type field effect transistor 1a is determined by the differential voltage between the gate electrode and the source node, and the differential voltage and, accordingly, the channel conductance are usually constant. In other words, the p-channel enhancement type field effect transistor 1a is expected to supply constant current to the common drain node N1. The channel conductance of the n-channel enhancement type field effect transistor 1b is also dependent on the differential voltage between the gate electrode and the source node. However, the bias voltage and, accordingly, the voltage level at the source node are variable, and the n-channel enhancement type field effect transistor 1b changes the channel conductance in accordance with the bias voltage. For example, if the bias voltage becomes shallow, i.e., small in the absolute value, the differential voltage is decreased, and the channel conductance is, accordingly, decreased. On the other hand, if the bias voltage becomes deep or large in absolute value, the differential voltage and, accordingly, the channel conductance are increased. This means that the discharge current from the common drain node N1 is proportional to the absolute value of the bias voltage, and the voltage level at the common drain node N1 is inversely proportional to the absolute value of the bias voltage. The voltage level at the common drain node N1 is amplified while propagated by the series of inverters 1c, and the control signal CTL1 is indicative of the fluctuation of the bias voltage.

Thus, the prior art voltage monitoring circuit 1 produces the control signal CTL1 on the basis of difference between the channel conductance of the p-channel enhancement type field effect transistor 1a and the channel conductance of the n-channel enhancement type field effect transistor 1b, and the sensitivity thereof is regulable by changing the transistor size.

In operation, the prior art dynamic random access memory device is assumed to be powered at time t0 as shown in FIG. 3, the external power voltage level Vcc is distributed to the internal step-down circuit 3 as well as the substrate bias system, and the reference voltage Vref rises together with the external power voltage level Vcc. The reference voltage Vref reaches 3.3 volts at time t1, and the external power voltage level Vcc is saturated to 5.0 volts at time t2. However, the internal power voltage level Vint is gradually increased toward 3.3 volts, and the prior art substrate bias system starts on negatively biasing the semiconductor substrate at time t3. For this reason, the substrate voltage Vsub barely reaches $-2.0$ volts at time t4, and the prior art dynamic random access memory device enters accessible state.

In general, a semiconductor device manufacture guarantees device characteristics of products, and one of the guaranteed items is time period from a power switch-on to entry into the accessible state. If the semiconductor device manufacture guarantees that the semiconductor substrate should be biased to $-2$ volts 100 microseconds, high sensitivity of the voltage monitoring circuit 1 is required, and the p-channel enhancement type field effect transistor 1a and the n-channel enhancement type field effect transistor 1b are enlarged so as to shrink the time period between time t0 to t4.

However, a problem is encountered in the prior art dynamic random access memory device in a large amount of current consumption due to the large sized transistors of the voltage monitoring circuit 1.

Moreover, the voltage monitoring circuit 1 detects the voltage fluctuation by using the difference in channel conductance between the p-channel enhancement type field effect transistor 1a and the n-channel enhancement type field effect transistor 1b, and the p-channel enhancement type and n-channel enhancement type field effect transistors 1a ad 1b are expected to have exactly adjusted transistor characteristics such as the threshold level. However, process parameters tend to be fluctuate, and the transistor characteristics are liable to be out of target range. This results in that the malfunction takes place in the substrate bias system, and the product is discarded as an inferior product.

SUMMARY OF THE INVENTION

It is therefore an important object of the present invention to provide a semiconductor integrated circuit device which is free from the problems inherent in the prior art semiconductor integrated circuit device.

To accomplish the object, the present invention proposes to bias a semiconductor substrate with a bias voltage produced from an external power voltage while a semiconductor integrated circuit passes through a transient period.

In accordance with the present invention, there is provided a semiconductor integrated circuit device fabricated on a semiconductor substrate, comprising: a) an internal circuit for predetermined functions; b) a power supply system having a means for distributing an external power voltage supplied from the outside of the semiconductor integrated circuit device, and an internal step-down circuit operative to produce an internal power voltage from the external power voltage and to regulate the internal power voltage to a predetermined reference level internally produced; and c) a substrate bias system operative to bias the semiconductor substrate to a certain level with a bias voltage, and having a first bias voltage producing circuit for producing the bias voltage from the external power voltage and a second bias voltage producing circuit for producing the bias voltage from the internal power voltage, the first bias voltage being activated before the internal power voltage catches up the predetermined reference level.

The semiconductor integrated circuit device may be a dynamic random access memory device.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 1:
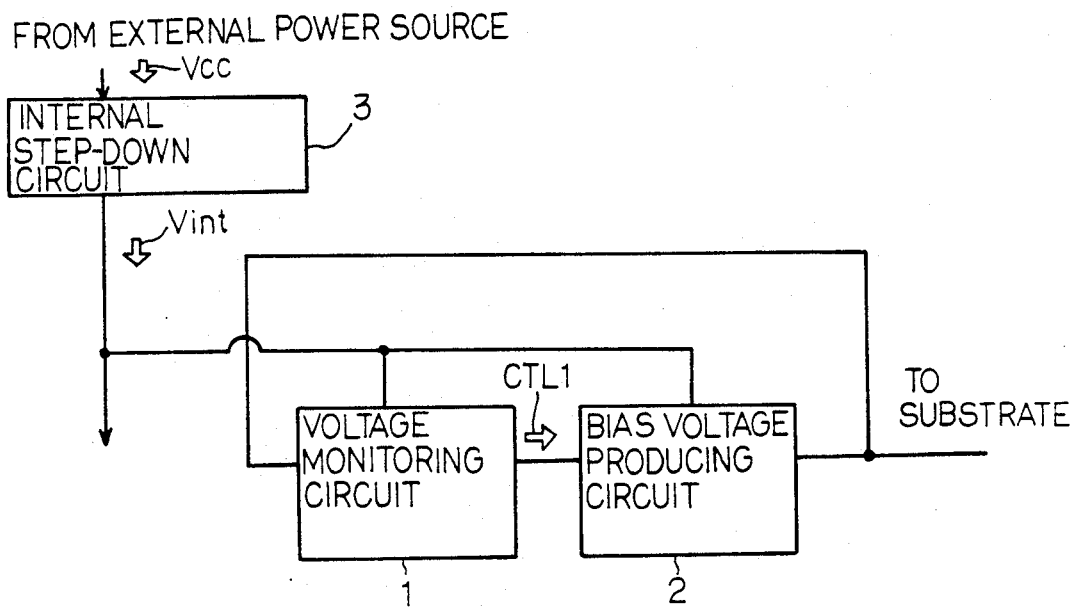
FIG. 1 is a block diagram showing the arrangement of the substrate bias system incorporated in the prior art dynamic random access memory device.
Figure 2:
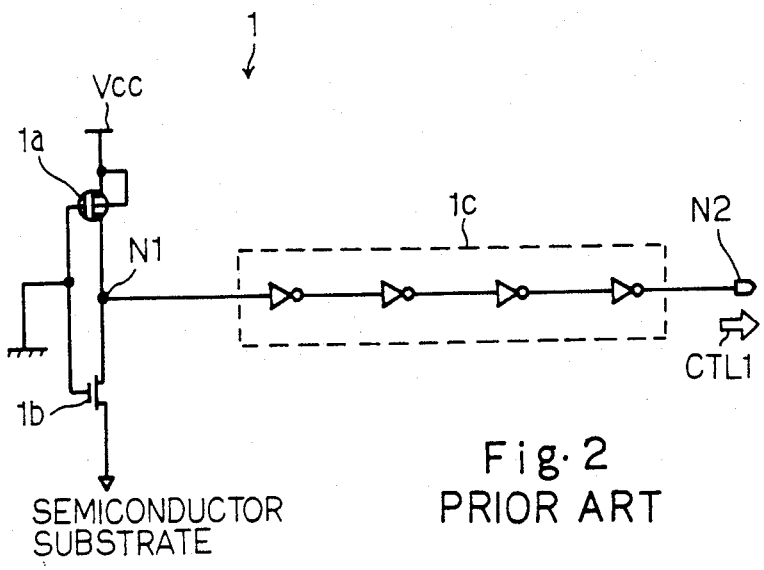
FIG. 2 is a circuit diagram showing the arrangement of the voltage monitoring circuit incorporated in the prior art dynamic random access memory device.
Figure 3:
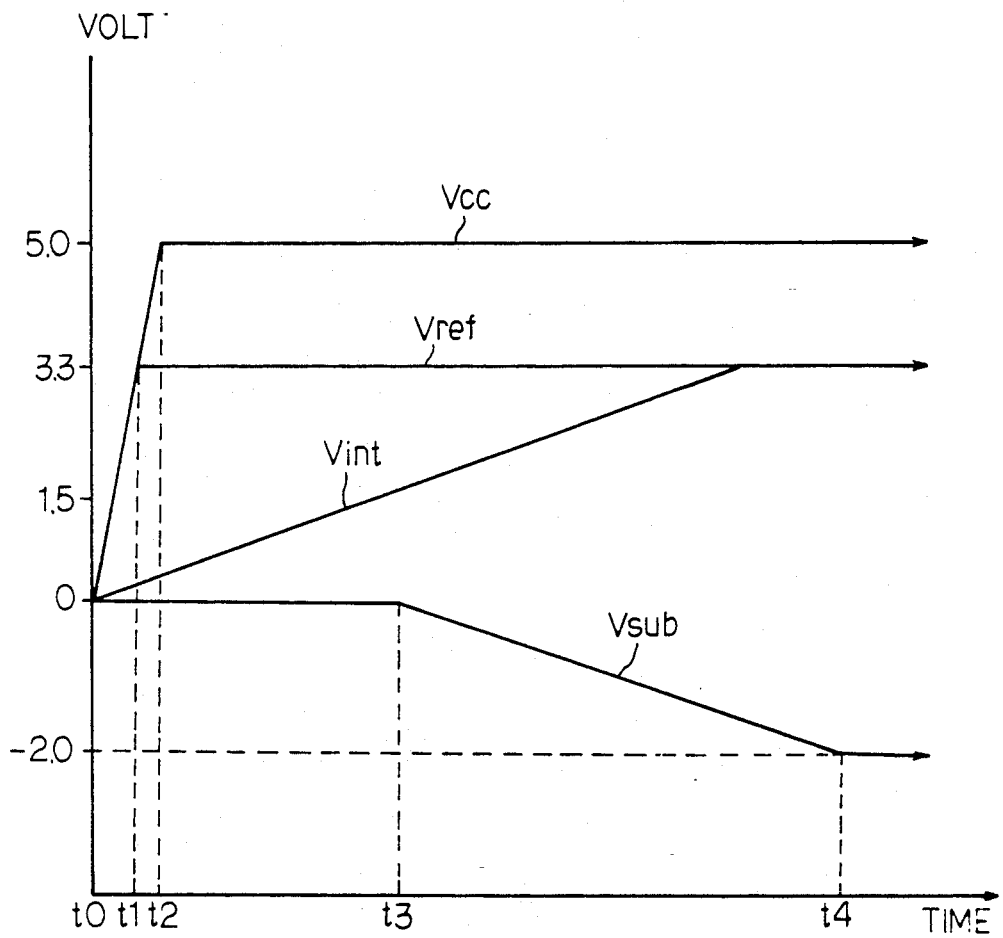
FIG. 3 is a graph showing the power voltage levels and the substrate voltage level of the prior art dynamic random access memory device.
Figure 4:
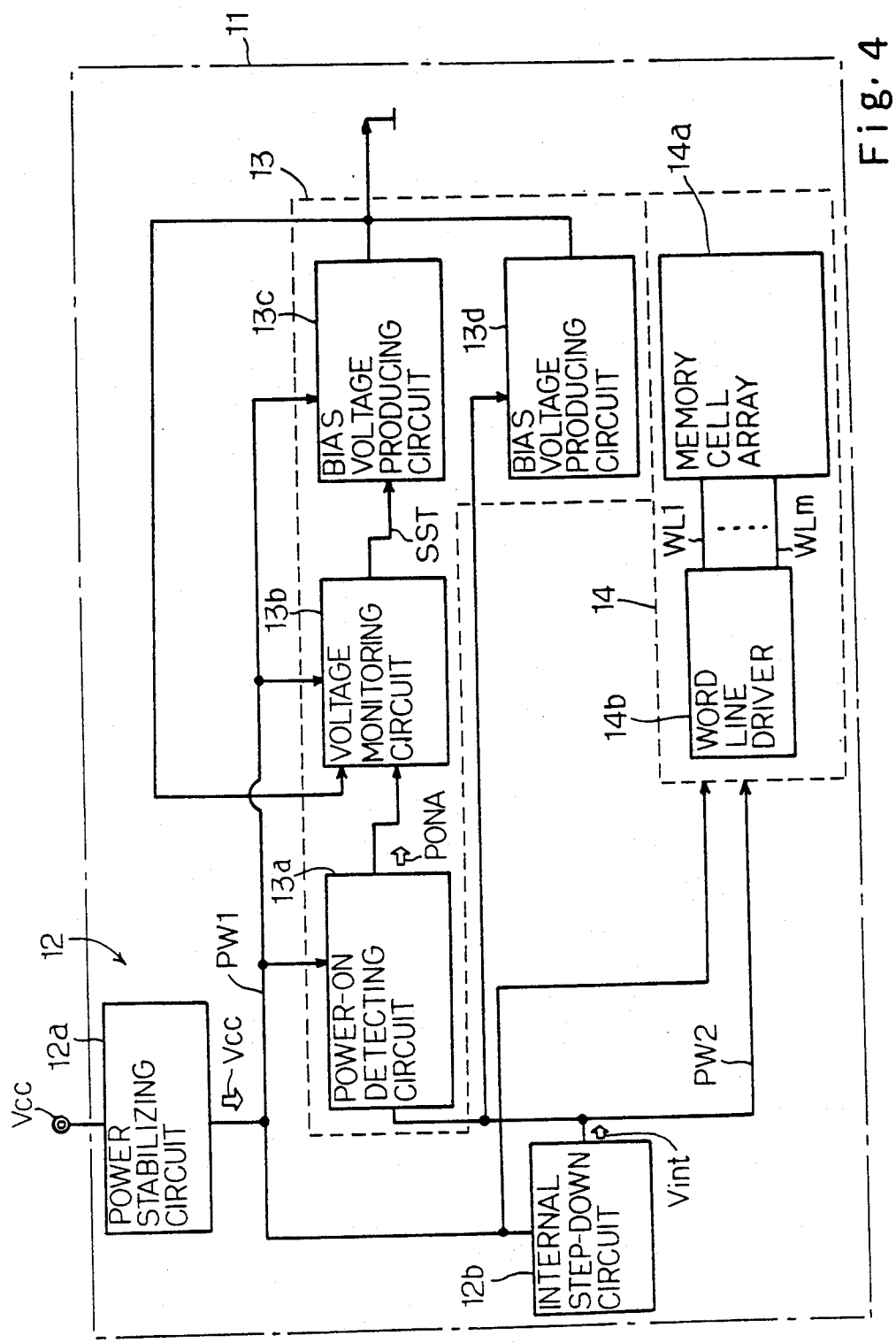
FIG. 4 is a block diagram showing the arrangement of a dynamic random access memory device equipped with a substrate bias system according to the present invention.

Referring to FIG. 4 of the drawings, a dynamic random access memory device embodying the present invention is fabricated on a semiconductor substrate 11, and largely comprises a power supply system 12, a substrate bias system 13 and a data storage facility 14. The power supply system has a power stabilizing circuit 12a and an internal step-down circuit 12b, and the power stabilizing circuit 12a is coupled with a power supply pin Vcc. An external power voltage Vcc of 5.0 volts is supplied from the outside of the dynamic random access memory device to the power supply pin Vcc, and the power stabilizing circuit 12a distributes the external power voltage Vcc through an external power voltage line PW1 to the internal step-down circuit 12b, the substrate bias system 13 and the data storage facility 14. The internal step-down circuit 12b compares an internal power voltage Vint with a reference voltage level Vref as will be described hereinlater, and regulates the internal power voltage Vint to 3.3 volts. The internal power voltage Vint is distributed through an internal power voltage line PW2 to the substrate bias system 13 and other units such as the data storage facility 14.

The data storage facility 14 comprises various circuits such as, for example, a memory cell array 14a, a word line driver 14b coupled through word lines WL1 to WLm with the memory cell array 14a. However, these circuits are well known to a person skilled in the art, and no further description is incorporated hereinbelow for the sake of simplicity.

Figure 5:
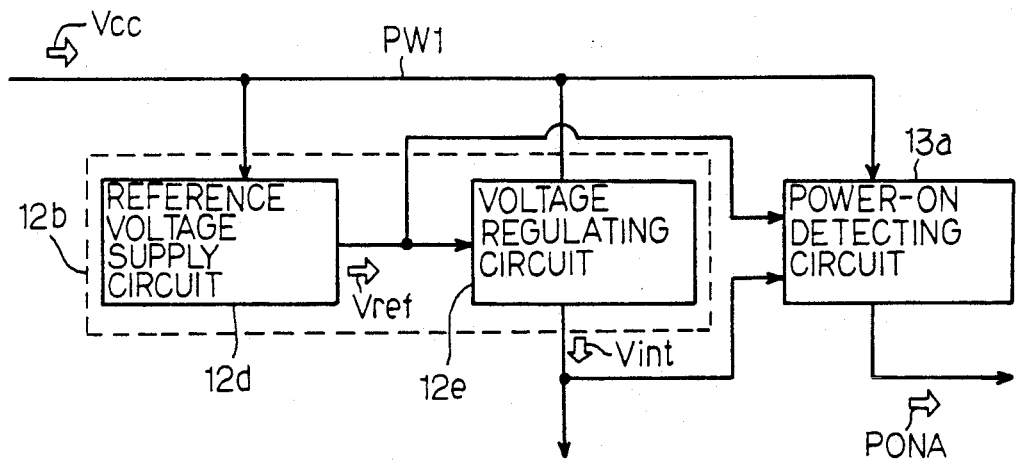
FIG. 5 is a block circuit showing the arrangement of an internal step-down circuit incorporated in the dynamic random access memory device.

The substrate bias system 13 comprises a power-on detecting circuit 13a, a voltage monitoring circuit 13b and two bias voltage producing circuits 13c and 13d. The power-on detecting circuit 13a is coupled with the internal step-down circuit 12b, and the internal step-down circuit 12b has a reference voltage supply circuit 12d and a voltage regulating circuit 12e as shown in FIG. 5. The reference voltage supply circuit 12d is, by way of example, implemented by a resistor string coupled between the external power voltage line PW1 and a ground voltage line, and produces the reference voltage level Vref from the external power voltage Vcc. The voltage regulating circuit 12e produces the internal power voltage Vint from the external power voltage Vcc, and is operative to match the internal power voltage Vint with the reference voltage Vref. For this reason, the voltage regulating circuit 12 is operable after the reference voltage Vref becomes stable, and time lag takes place between the reference voltage Vref and the internal power voltage Vint. The power-on detecting circuit 13a detects the time lag, and produces a detecting signal PONA from the external power voltage Vcc. The detecting signal PONA rises together with the external power voltage Vcc, and is decayed to the ground voltage level when the internal power voltage Vint catches up the reference voltage level Vref. In other words, the detecting signal PONA of high voltage level is indicative of transient time period after the external power voltage line PW1 starts on rising. Since the detecting signal PONA is shifted from the high voltage level to the low voltage level upon equalization between the reference voltage level Vref and the internal power voltage level Vint, the first bias voltage producing circuit 13c continuously biases the semiconductor substrate 11 until the second bias voltage producing circuit 13d is powered with the internal power voltage level Vint sufficiently developed.

Turning back to FIG. 4, the power-on detecting circuit 13a supplies the detecting signal PONA to the voltage monitoring circuit 13b, and the external power voltage Vcc is supplied to the voltage monitoring circuit 13b and the first bias voltage producing circuit 13c. For this reason, the first bias voltage producing circuit 13c is powered with the external power voltage Vcc, and is available before the lapse of the transient time period as described hereinbelow.

Figure 6:
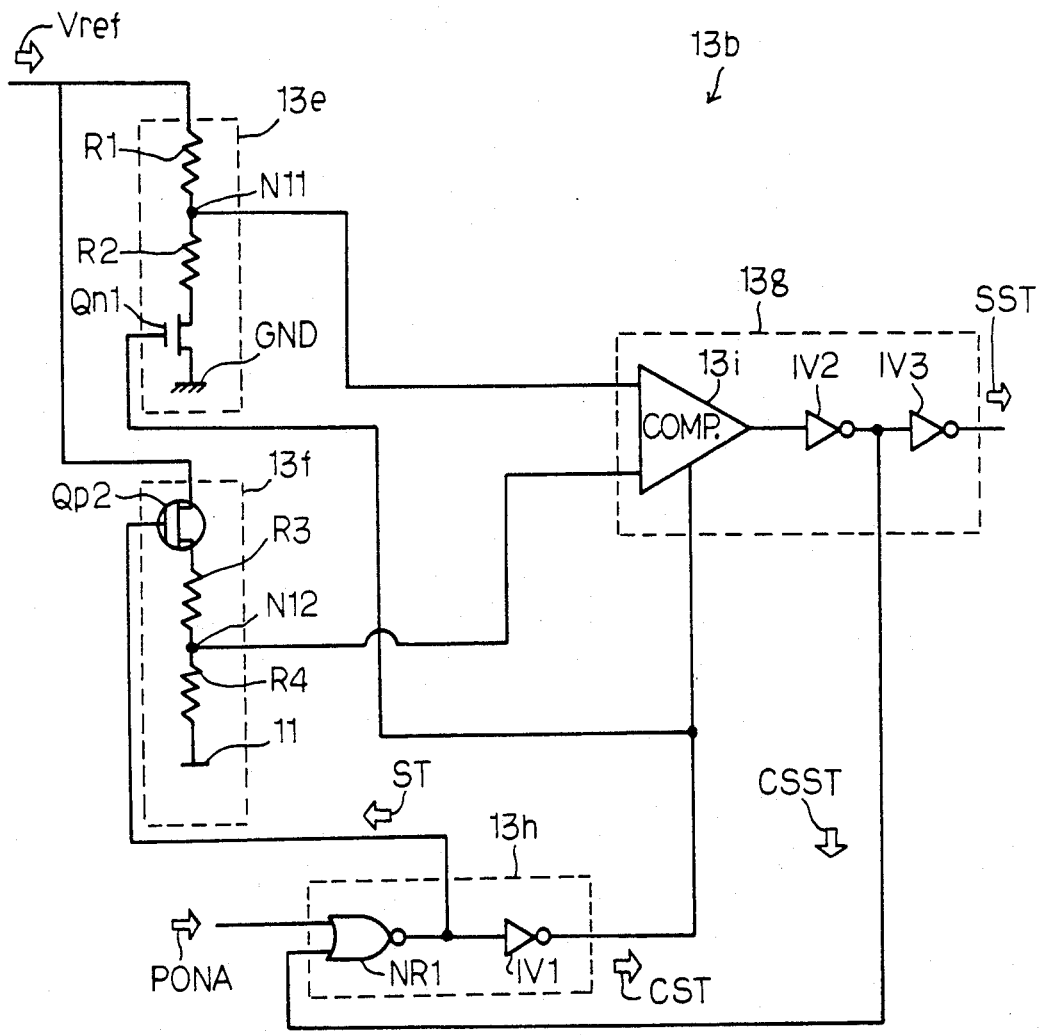
FIG. 6 is a circuit diagram showing the arrangement of a voltage monitoring circuit incorporated in a substrate bias system of the dynamic random access memory device.

Turning to FIG. 6 of the drawings, the voltage monitoring circuit 13b largely comprises a first voltage divider 13e coupled between the reference voltage line Vref and the ground voltage line GND, a second voltage divider 13f coupled between the reference voltage line Vref and the semiconductor substrate 11, a voltage comparing unit 13g coupled with the first and second voltage dividers 13e and 13f, and an activation circuit 13h. The activation circuit 13h has a NOR gate NR1 and an inverter IN1, and the detecting signal PONA is NORed with a complementary control signal CSST for producing an enable signal ST and the complementary enable signal CST. The first voltage divider 13e is implemented by a series combination of resistors R1 and R2 and an n-channel enhancement type switching transistor Qn1 coupled between the reference voltage line Vref and the ground voltage line GND, and a node N11 between the resistors R1 and R2 is coupled with the voltage comparing unit 13g. Similarly, the second voltage divider 13f is implemented by a series combination of p-channel enhancement type switching transistor Qp2 and resistors R3 and R4 coupled between the reference voltage line Vref and the semiconductor substrate 11, and a node N12 between the resistors R3 and R4 is coupled with the voltage comparing unit 13g. The enable signal ST and the complementary enable signal CST are supplied from the activation circuit 13h to the gate electrode of the p-channel enhancement type switching transistor Qp2 and the gate electrode of the n-channel enhancement type switching transistor Qn1, and are concurrently turned on for activating the first and second voltage dividers 13e and 13f. The voltage comparing unit 13g comprises a voltage comparator 13i coupled with the nodes N11 and N12, and a series combination of inverters IV2 and IV3 coupled with the output node of the voltage comparator 13i. A control signal SST and the complementary control signal CSST are produced by the inverters IV3 and IV2, respectively, and the control signal SST is indicative of the outside of the control range of the voltage level Vsub.

Variation of the substrate voltage level Vsub is reflected to variation of the voltage level at the node N12, and the node N11 produces a constant voltage level. The voltage comparator 13i compares the voltage level at the node N12 with the voltage level at the node N11, and decides whether or not to produce the control signal SST. Even though the first and second voltage dividers 13e and 13f contain the n-channel enhancement type switching transistor Qn1 and the p-channel enhancement type switching transistor Qp2, the channel resistances are small enough to be ignored with respect to the resistances of the resistors R1 to R4, and any fluctuation of process parameters does not affect characteristics of the first and second voltage dividers 13e and 13f.

Figure 7:
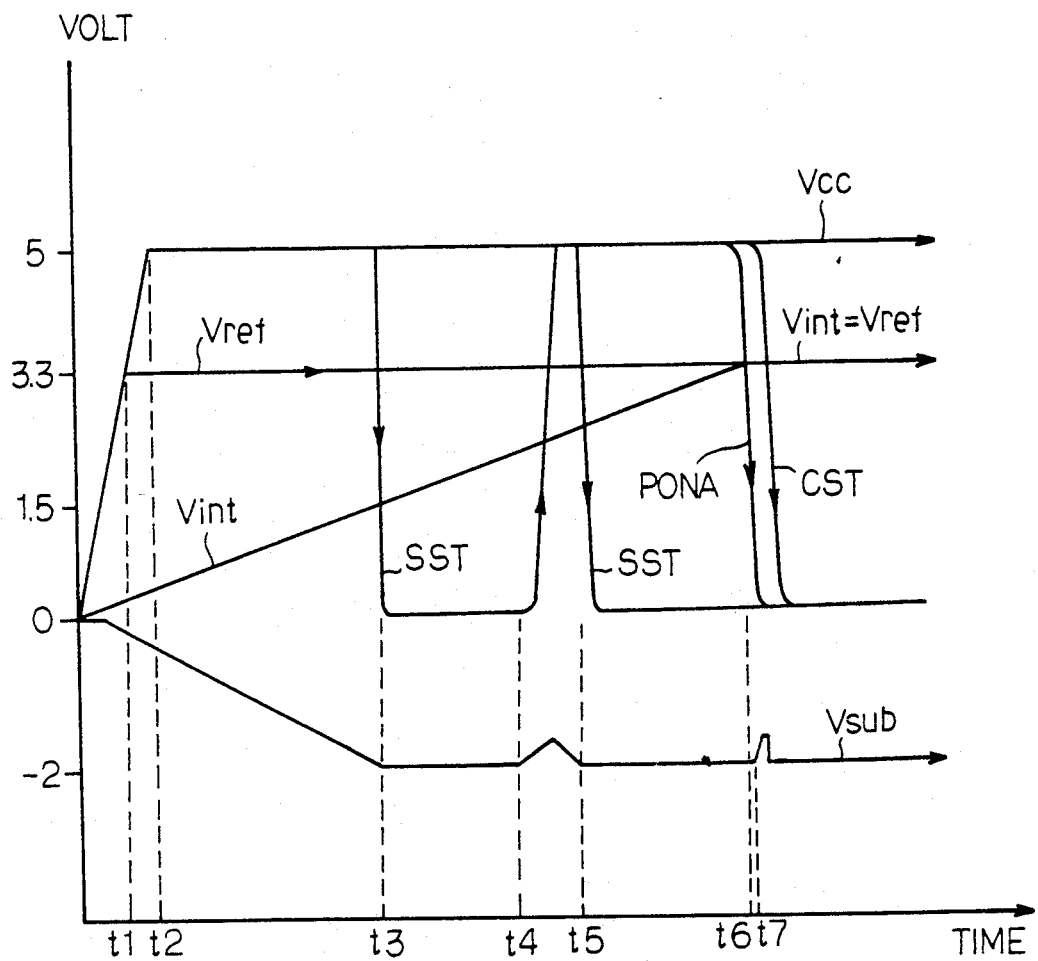
FIG. 7 is a graph showing power voltage levels and essential signals in a transient time period after the dynamic random access memory device is powered with the external power voltage.

The voltage monitoring circuit thus arranged behaves as follows. As described hereinbefore, when the dynamic random access memory device is powered, the reference voltage level Vref rises together with the external power voltage Vcc, and reaches 3.3 volts at time t1 as shown in FIG. 7. The external power voltage Vcc reaches 5.0 volts at time t2. However, the internal power voltage Vint gradually rises toward the reference voltage Vref, and catches up the reference voltage Vref at time t6. Therefore, the detecting signal PONA remains in high voltage level before time t6, and goes down to the ground voltage level together with the detecting signal PONA. While the detecting signal PONA is kept at the high voltage level corresponding to logic "1" level before time t1, the NOR gate NR1 is disabled with the detecting signal PONA of logic "1" level, and continuously yields the enable signal ST of logic "0" level corresponding to low voltage level. Accordingly, the inverter IV1 produces the complementary enable signal CST of logic "1" level, and the enable signal ST and the complementary enable signal CST are supplied to the second voltage divider 13f and both of the first voltage divider 13e and the voltage comparing unit 13g. With the enable signal of logic the low voltage level and the complementary enable signal CST of the high voltage level, the p-channel enhancement type switching transistor Qp2 and the n-channel enhancement type switching transistor Qn1 turn on, and, accordingly, the first and second voltage dividers 13e and 13f are activated. The complementary enable signal CST of the high voltage level further activates the voltage comparing unit 13g for monitoring the voltage level Vsub of the semiconductor substrate 11. When the dynamic random access memory device is powered, the semiconductor substrate 11 is in the ground voltage level, and the comparator 13i causes the inverter IV3 to produce the control signal SST of the high voltage level. The bias voltage producing circuit 13c is activated with the control signal SST of the high voltage level, and the semiconductor substrate 11 gradually goes down toward −2.0 volts immediately after the power-on.

If the semiconductor substrate 11 reaches −2.0 volts at time t3, the voltage comparing unit 13g allows the control signal SST to recover from the high voltage level to the low voltage level, and the bias voltage producing circuit 13c interrupts the negative bias operation. However, if the semiconductor substrate 11 slightly rises at time t4, the control signal SST goes up to the high voltage level again, and the bias voltage producing circuit 13c pulls down the semiconductor substrate 11, and the semiconductor substrate 11 is recovered to −2.0 volts again at time t5. Thus, while the internal power voltage level rises toward 3.3 volts, the voltage monitoring circuit 13b is activated with the detecting signal PONA, and the bias voltage producing circuit 13c is intermittently driven for negative biasing so as to keep the semiconductor substrate 11 around −2.0 volts.

If the internal power voltage level Vint catches up the reference voltage level Vref at time t6, the detecting signal PONA is recovered to the low voltage level, and the NOR gate NR1 is enabled with the detecting signal PONA. The NOR gate NR1 thus enabled is responsive to the complementary control signal CSST. If the semiconductor substrate 11 remains at −2.0 volts, the complementary control signal CST is kept at logic "1" level, and the NOR gate NR1 and the inverter IV1 allow the enable signal ST and the complementary enable signal CST to remain at the low voltage level and at the high voltage level. However, if the semiconductor substrate 11 slightly rises at time t7, the comparator 13i supplies the high voltage level to the inverter IV2, and the inverter IV2 supplies the low voltage level to the NOR gate NR1. Then, the NOR gate NR1 shifts the enable signal ST from logic "0" level to logic "1" level, and supplies the high voltage level to the p-channel enhancement type switching transistor Qp2. Accordingly, the inverter IV1 shifts the complementary enable signal CST from logic "1" level to logic "0" level, and supplies the low voltage level to the n-channel enhancement type switching transistor Qn1 and the comparator 13i. Then, the n-channel enhancement type switching transistor Qn1 turns off, and the comparator 13i enters inactive state. In other words, the first and second voltage dividers 13f and 13e as well as the comparator 13g become silent, and are cut from the negative bias operation. However, the second bias voltage producing circuit 13d is powered with the internal power voltage level Vint already sufficiently developed, and the semiconductor substrate 11 is negatively biased by the second bias voltage producing circuit 13d.

Thus, the semiconductor substrate 11 is negatively biased immediately after the power-on, and reaches −2.0 volts well before the internal power voltage level Vint catches up the reference voltage level Vref. Therefore, the dynamic random access memory device according to the present invention easily clear the guaranteed item without sacrifice of power consumption. Moreover, the first and second voltage dividers 13e and 13f are less affected by fluctuation of process parameters, and the dynamic random access memory device according to the present invention is reliable.

Figure 8:
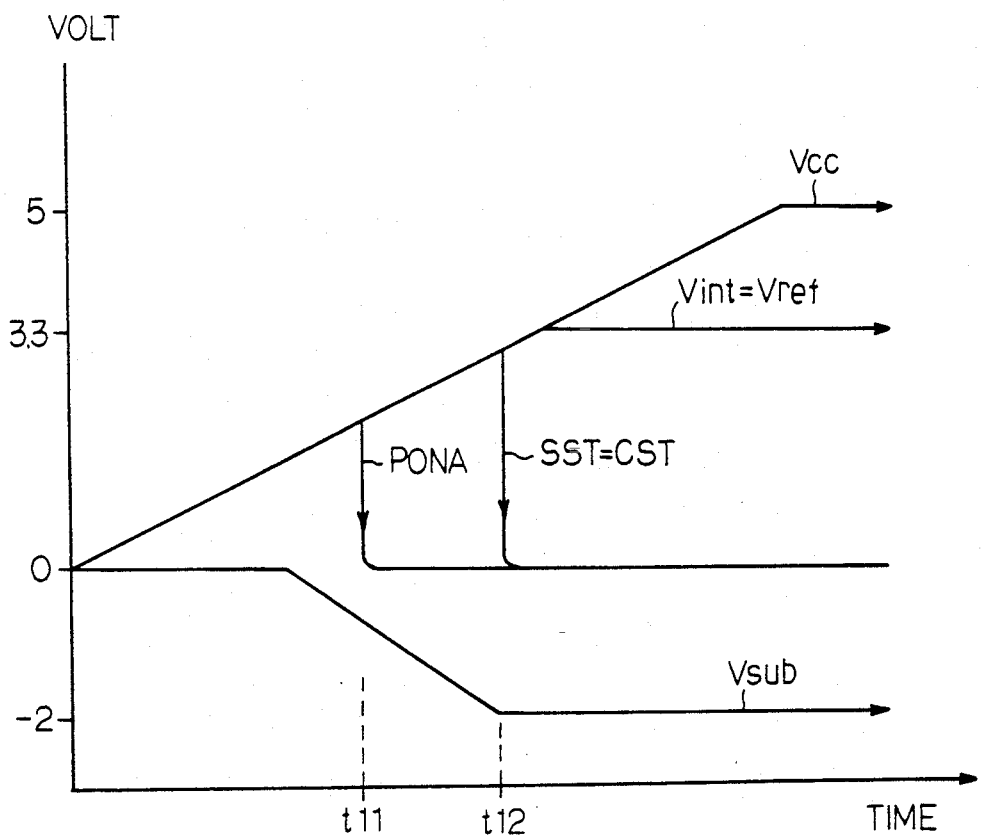
FIG. 8 is a graph showing the voltage levels and the essential signals in the transient period if the external power voltage slowly rises.

If the external power voltage level Vcc slowly rises as shown in FIG. 8, the internal power voltage level Vint may be increased in parallel to the reference voltage Vref, and the detecting signal PONA goes down to the low voltage level at time t11. In order to continuously activate the first bias voltage producing circuit 13c, the activation circuit 13h may be rearranged in such a manner as to retard the control signal SST as shown in FIG. 8.

Figure 9:
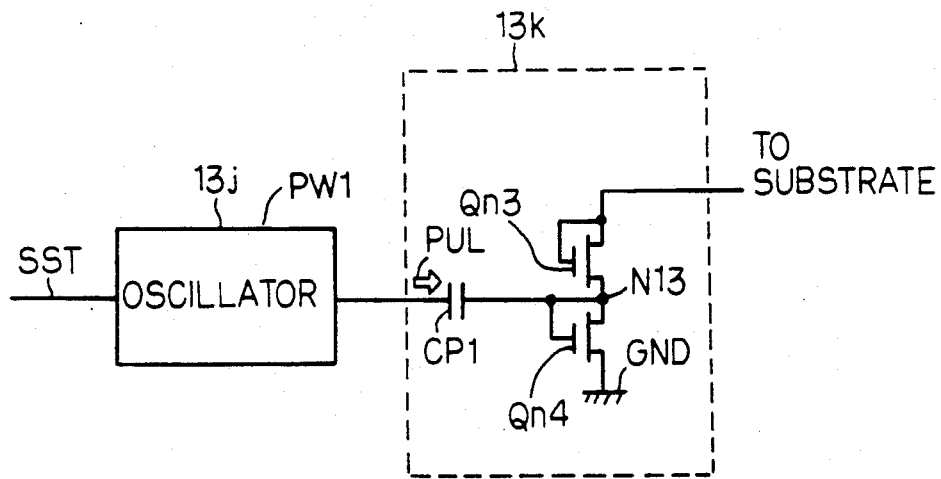
FIG. 9 is a circuit diagram showing the arrangement of a first bias voltage producing circuit incorporated in the dynamic random access memory device.
Figure 10:
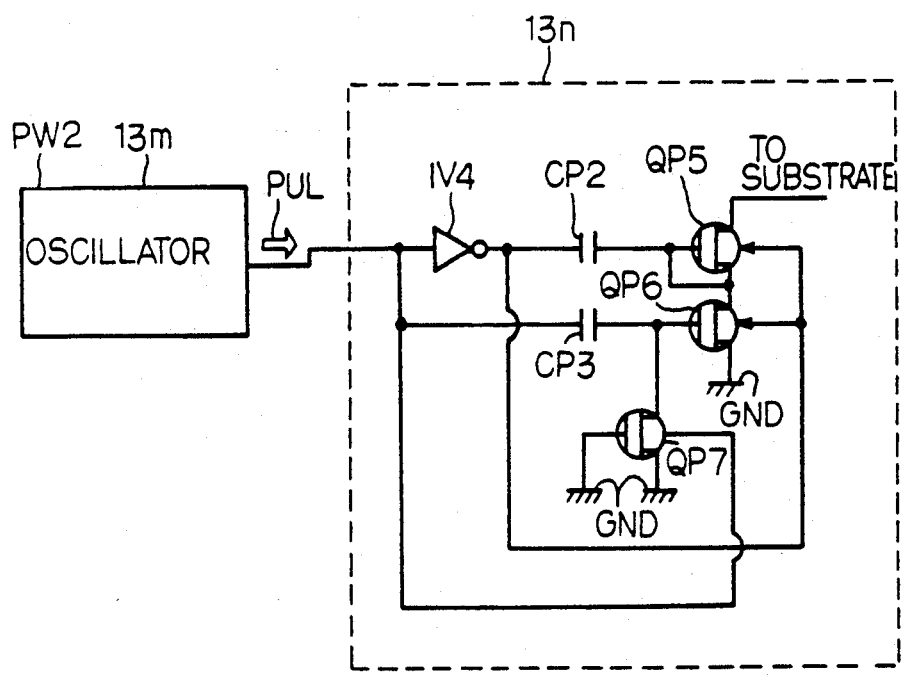
FIG. 10 is a circuit diagram showing the arrangement of a second bias voltage producing circuit incorporated in the dynamic random access memory device.

Various circuit arrangements are employable for the first and second bias voltage producing circuits 13c and 13d, and FIGS. 9 and 10 illustrate two employable examples, respectively. FIG. 9 illustrates the first employable example, and comprises an oscillator 13j and a bias circuit 13k. The oscillator 13j is responsive to the control signal SST for producing a pulse train PUL. The bias circuit 13k comprises a capacitor CP1 and a series combination of n-channel enhancement type transfer transistors Qn3 and Qn4 coupled between the semiconductor substrate 11 and the ground voltage line GND. The gate electrode of the n-channel enhancement type transfer transistor Qn3 is coupled with the semiconductor substrate 11, and, for this reason, the n-channel enhancement type transfer transistor Qn3 turns on when the voltage level Vsub becomes higher than the negative voltage level at the common drain node N13 supplied from the capacitor CP1 by the threshold level thereof. On the other hand, the gate electrode of the n-channel enhancement type transfer transistor Qn4 is coupled with the common drain node N13, and the n-channel enhancement type transfer transistor Qn4 turns on while the common drain node N13 exceeds the threshold level thereof. Therefore, if the voltage level Vsub becomes higher, the voltage monitoring circuit 13b supplies the control signal SST to the oscillator 13j, and the pulse train PUL causes the capacitor CP1 to periodically pull down the common drain node N13 to the negative level. The n-channel enhancement type transfer transistor Qn3 also periodically turns on so as to pull down the semiconductor substrate 11. The n-channel enhancement type transfer transistors Qn3 and Qn4 are large in current driving capability, and is desirable for rapid voltage decay. However, minority carriers are injected into the semiconductor substrate 11, and is less desirable for data retaining characteristics of the memory cell array 14a. For this reason, the first employable example is appropriate for the first bias voltage producing circuit 13c.

Turning to FIG. 10 of the drawings, the second employable example comprises an oscillator 13m and a bias circuit 13n. The bias circuit 13n has an inverter IV4, two capacitors CP2 and CP3 and p-channel enhancement type transfer transistors Qp5, Qp6 and Qp7. The p-channel enhancement type transfer transistors Qp5 and Qp6 are coupled in series between the semiconductor substrate 11 and the ground voltage line GND, and the gate electrodes thereof are coupled with the capacitors CP2 and CP3, respectively. The remaining p-channel enhancement type transfer transistor Qp7 is coupled between the capacitor CP3 and the ground voltage line GND, and the gate electrode thereof is grounded. The oscillator 13m also produces a pulse train PUL, and supplies the pulse train PUL through the inverter IV4 to the capacitor CP2 and directly to the capacitor CP3. The capacitors C2 and C3 alternately supplies the ground voltage level and negative voltage level to the p-channel enhancement type switching transistors Qp5 and Qp6. If the semiconductor substrate 11 rises from −2.0 volts, the p-channel enhancement type switching transistor Qp5 turns on, and the semiconductor substrate 11 is negatively biased. However, while the semiconductor substrate 11 is properly biased to −2.0 volts, the p-channel enhancement type switching transistor Qp5 remains off, and the negative voltage is discharged through the p-channel enhancement type switching transistor Qp6 to the ground voltage line GND.

Although the second employable example is relatively small in current driving capability rather than the first employable example, any minority carriers do not flow into the semiconductor substrate 11, and is desirable for the second bias voltage producing circuit 13d.

Second Embodiment

Figure 11:
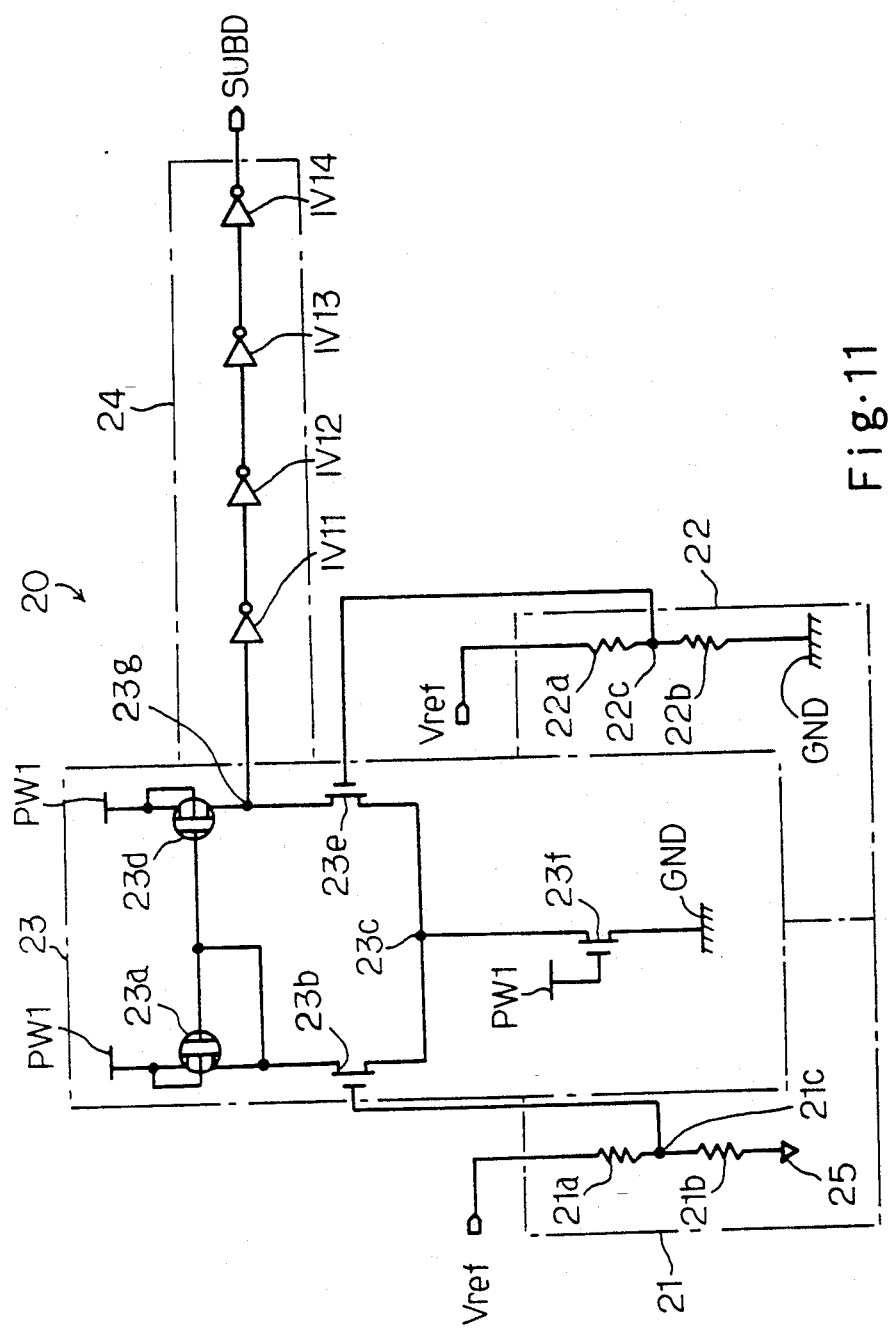
FIG. 11 is a circuit diagram showing a voltage monitoring circuit incorporated in another large scale integrated circuit embodying the present invention.

Turning to FIG. 11 of the drawings, a voltage monitoring circuit 20 incorporated in another large scale integrated circuit comprises a first voltage divider 21, a second voltage divider 22, a current mirror circuit 23 and an output circuit 24. The voltage monitoring circuit 20 is associated with a first bias voltage producing circuit (not shown) corresponding to the first bias voltage producing circuit 13c powered with an external power voltage Vcc, and forms a substrate bias system together with the first bias voltage producing circuit and a second bias voltage producing circuit corresponding to the second bias voltage producing circuit 13d. Though not shown in the drawings, the large scale integrated circuit further comprises a power supply system corresponding to the power supply system 12 and a main circuit for a predetermined circuit, and is fabricated on a semiconductor substrate 25.

The first voltage divider 21 is implemented by resistors 21a and 21b coupled in series between the reference voltage line Vref and the semiconductor substrate 25, and produces a quasi substrate voltage proportional to the substrate voltage Vsub at a node 21c. The second voltage divider 22 is also implemented by resistors 22a and 22b coupled in series between the reference voltage line Vref and the ground voltage line GND, and a certain positive voltage takes place at a node 22c between the resistors 22a and 22b. The current mirror circuit 23 comprises a series combination of a p-channel enhancement type load transistor 23a and an n-channel enhancement type amplification transistor 23b coupled between the external power voltage line PW1 and a node 23c, a series combination of a p-channel enhancement type load transistor 23d and an n-channel enhancement type amplification transistor 23e coupled between the external power voltage line PW1 and the node N23c, and a constant current source 23f implemented by an n-channel enhancement type field effect transistor coupled between the node 23c and the ground voltage line GND. The gate electrodes of the n-channel enhancement type amplification transistors 23b and 23e are respectively coupled with the nodes 21c and 22c, and differential voltage between the nodes 21c and 22c is increased through cooperation of the n-channel enhancement type amplification transistors 23b and 23e so that an output voltage signal indicative of the differential voltage takes place at a node 23g. The output circuit 24 is implemented by a series combination of inverters IV11, IV12, IV13 and IV14 coupled with the node 23g, and produces a control signal SUBD from the output voltage signal at the node 23g.

The voltage monitoring circuit thus arranged behaves as follows. The quasi substrate voltage V1 at the node 21c is given by Equation 1, and the certain voltage V2 at the node 22c is calculated through Equation 2.

$$V1 = (R21b \times Vref + R21a \times Vsub)/(Ra + Rb)$$  Equation 1

$$V2 = (R22b \times Vref)/(R22a + R22b)$$  Equation 2 where R21a, R21b, R22a and R22b are resistances of the resistors 21a, 21b, 22a and 22b. Both reference voltage line Vref and the ground voltage line are constant, and, accordingly, the certain voltage level V2 is constant. For this reason, the n-channel enhancement type amplification transistor 23e is substantially constant in channel resistance. Any variation of the substrate voltage Vsub affects the quasi substrate voltage V1, and the n-channel enhancement type amplification transistor 23b is variable in channel resistance depending upon the quasi substrate voltage V1 and, accordingly, the substrate voltage Vsub. For example, if the substrate voltage Vsub proceeds toward the negative side, the quasi substrate voltage V1 increases the channel resistance of the n-channel enhancement type amplification transistor 23b, and the p-channel enhancement type load transistors 23a and 23d concurrently increase the channel resistances thereof. As a result, the output voltage signal becomes lower than the threshold level of the inverter IV11, and the control signal SUBD finally goes down to the low voltage level or the ground voltage level. On the other hand, if the substrate voltage Vsub becomes closer to the ground voltage level, the quasi substrate voltage V1 rises, and the n-channel enhancement type amplification transistor 23b decreases the channel resistance. The p-channel enhancement type load transistors 23a and 23d decrease the channel resistances thereof, and the output voltage signal at the node 23g exceeds the threshold level of the inverter IV11. As a result, the control signal SUBD is shifted to the high voltage level or the external power voltage level Vcc, and activates the first bias voltage producing circuit (not shown).

The resistors 21, 21b, 22a and 22b are regulated in such a manner that the quasi substrate voltage V1 is lower than the certain voltage level V2 at the substrate voltage Vsub of zero, and the control signal SUBD is inverted when the quasi voltage level V1 exceeds the certain voltage level V2.

The resistances of the resistors 21a, 21b, 22a and 22b are hardly affected by fluctuation of process parameters, and the voltage monitoring circuit 20 is reliable.

Third Embodiment

Figure 12:
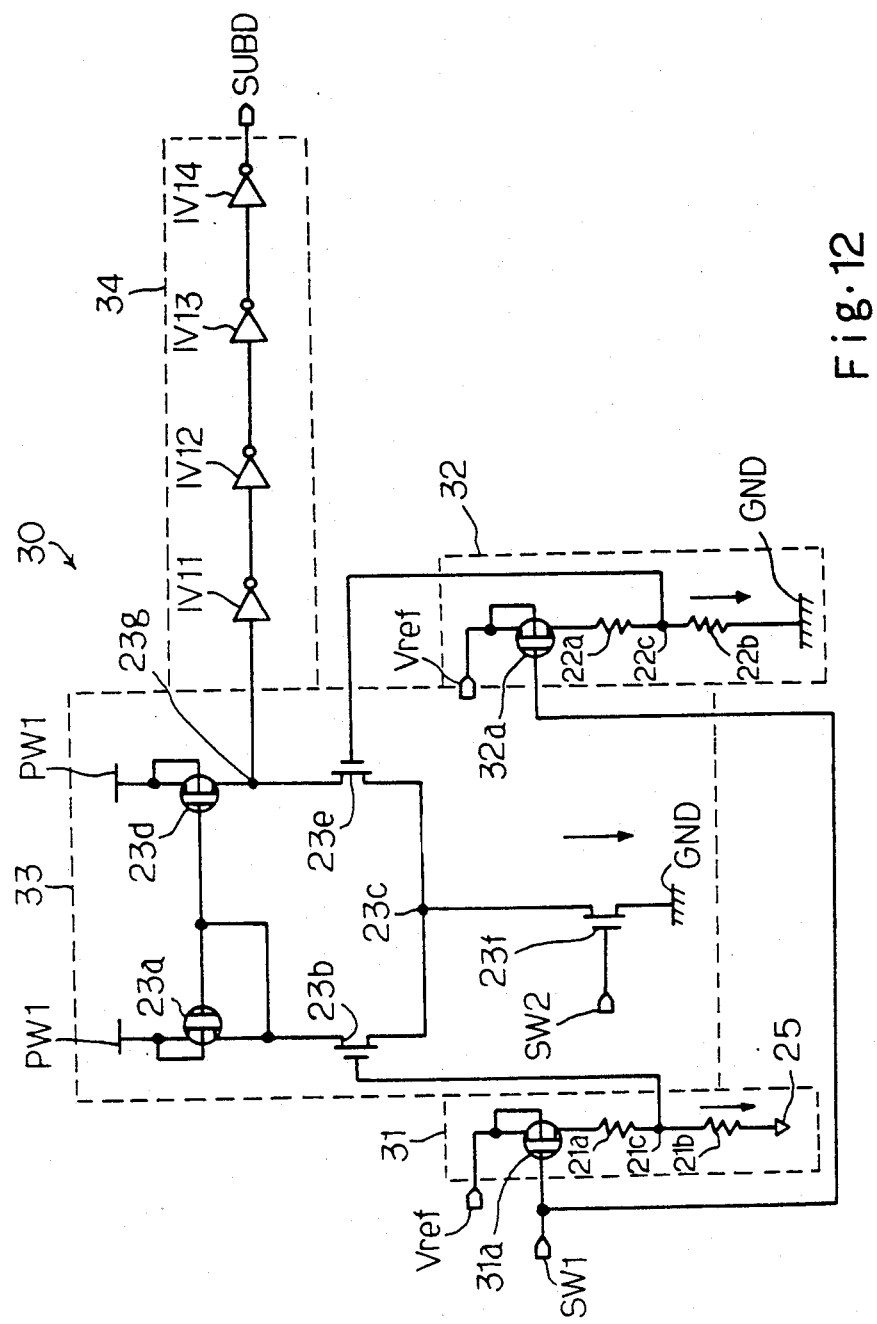
FIG. 12 is a circuit diagram showing a voltage monitoring circuit incorporated in yet another large scale integrated circuit embodying the present invention.

Turning to FIG. 12 of the drawings, yet another voltage monitoring circuit 30 comprises a first voltage divider 31, a second voltage divider 32, a current mirror circuit 33 and an output circuit 34, and forms a part of a substrate bias system incorporated in an large scale integrated circuit. Although a power-on detecting circuit corresponding to circuit 13a is further added, other component circuits of the substrate bias system are similar to those of the second embodiment, and no further description is incorporated hereinbelow for the sake of simplicity.

The voltage monitoring circuit 20 is further similar in circuit arrangement to that of the second embodiment except for p-channel enhancement type switching transistors 31a and 32a, and the circuit components are labeled with the same references designating the corresponding circuit components of the voltage monitoring circuit 20. The p-channel enhancement type switching transistors 31a and 32a are gated by a first enable signal SW1, and the n-channel enhancement type switching transistor 23g is gated by a second enable signal SW2. While the internal power voltage level Vint rises toward the reference voltage level Vref, the first enable signal SW1 remains in the low voltage level, and the second enable signal SW2 is kept in the high voltage level, and the first and second voltage dividers 31 and 32 as well as the current mirror circuit 33 are activated for producing the control signal SUBD. However, after the internal power voltage level Vint catches up the reference voltage level Vref, the second bias voltage producing circuit (not shown) negatively biases the semiconductor substrate 25, and the first and second voltage dividers 31 and 32 as well as the current mirror circuit 33 become inactive so that no current is consumed by the voltage monitoring circuit 30.

The resistors 21, 21b, 22a and 22b are similarly regulated in such a manner that the quasi substrate voltage V1 is lower than the certain voltage level V2 at the substrate voltage Vsub of zero, and the control signal SUBD is inverted when the quasi voltage level V1 exceeds the certain voltage level V2, and the resistances of the resistors 21a, 21b, 22a and 22b are hardly affected by fluctuation of process parameters.

Although particular embodiments of the present invention have been shown and described, it will be obvious to those skilled in the art that various changes and modifications may be made without departing from the spirit and scope of the present invention. For example, a voltage monitoring circuit may be provided for the bias voltage producing circuit 13d powered with the internal power voltage Vint for intermittently biasing the semiconductor substrate.

What is claimed is:

1. A semiconductor integrated circuit device fabricated on a semiconductor substrate, comprising:
   a) an internal circuit;
   b) a power supply system having a means for distributing an external power voltage supplied from the outside of said semiconductor integrated circuit device, and an internal step-down circuit operative to produce an internal power voltage from said external power voltage and to regulate said internal power voltage to a predetermined reference level internally produced; and
   c) a substrate bias system operative to bias said semiconductor substrate to a certain level with a bias voltage, and having a first bias voltage producing circuit for producing said bias voltage from said external power voltage and a second bias voltage producing circuit for producing said bias voltage from said internal power voltage, and first bias voltage producing circuit being activated before said internal power voltage level reaches said predetermined reference level.

2. A semiconductor integrated circuit device as set forth in claim 1, in which said substrate bias system further has a power-on detecting circuit for producing a detecting signal when said internal power voltage level reaches said predetermined reference level, and a voltage monitoring circuit operative to monitor a voltage level of said semiconductor substrate for supplying a control signal indicative of a difference from said certain level for activating said first bias voltage producing circuit.

3. A semiconductor integrated circuit device as set forth in claim 2, in which said voltage monitoring circuit comprises a first voltage divider coupled between a reference voltage line for said predetermined reference voltage and said semiconductor substrate and activated with a first complementary signal for producing a quasi substrate voltage signal, a second voltage divider coupled between said reference voltage line and a constant voltage line and activated with an enable signal at an active level complementary to said first complementary signal for producing a constant voltage signal, an activation circuit responsive to said detecting signal and a second complementary signal of said control signal having an active level for producing said enable signal and said first complementary signal, and a voltage comparing circuit activated with said first complementary signal and operative to compare said quasi substrate voltage signal with said constant voltage signal for producing said control signal and said second complementary signal, said enable signal and said second complementary signal being kept in said active levels while said internal power voltage rises toward said predetermined reference level.

4. A semiconductor integrated circuit as set forth in claim 3, in which said first and second voltage dividers have a series combination of a first enhancement type switching transistor of a first channel conductivity type and a plurality of first resistors, and a series combination of a second enhancement type switching transistor of a second channel conductivity type opposite to said first channel conductivity type and a plurality of second resistors, respectively.

5. A semiconductor integrated circuit device as set forth in claim 3, in which said activation circuit comprises a NOR gate supplied with said detecting signal and said second complementary signal for producing said enable signal, and a first inverter coupled with an output node of said NOR gate for producing said first complementary signal.

6. A semiconductor integrated circuit device as set forth in claim 3, in which said voltage comparing circuit comprises a voltage comparator activated with said first complementary signal and operative to compare said quasi substrate voltage signal with said constant voltage signal, and a series combination of inverters coupled with an output node of said voltage comparator for producing said second complementary signal and said control signal.

7. A semiconductor integrated circuit device as set forth in claim 2, in which said voltage monitoring circuit comprises a first voltage divider coupled between a reference signal line for said predetermined reference voltage level and said semiconductor substrate for producing a quasi substrate voltage signal, a second voltage divider coupled between said reference voltage line and a constant voltage line for producing a constant voltage signal, a current mirror circuit responsive to difference between said quasi substrate voltage signal and said constant voltage signal for producing an output voltage signal, and an output circuit supplied with said output voltage signal for producing said control signal.

8. A semiconductor integrated circuit device as set forth in claim 7, in which said first and second voltage dividers have a plurality of first resistors coupled in series and a plurality of second resistors coupled in series, respectively.

9. A semiconductor integrated circuit device as set forth in claim 7, in which said first voltage divider has a first enhancement type switching transistor of a first channel conductivity type and a plurality of first resistors coupled in series between said first enhancement type switching transistor and said semiconductor substrate, and said second voltage divider has a second enhancement type switching transistor of said first channel conductivity type and a plurality of second resistors coupled in series between said second enhancement type switching transistor and said constant voltage line, said first and second enhancement type switching transistors turning on with a first enable signal before said internal power voltage level reaches said predetermined reference level.

10. A semiconductor integrated circuit device as set forth in claim 9, in which said current mirror circuit comprises a series combination of a first enhancement type load transistor of said first channel conductivity type and a first enhancement type amplifying transistor of a second channel conductivity type opposite to said first channel conductivity type coupled between a power voltage line of said external power voltage and a common node, a series combination of a second enhancement type load transistor of said first channel conductivity type and a second enhancement type amplifying transistor of said second channel conductivity type coupled between said power voltage line of said external power voltage and said common node, and a third enhancement type switching transistor coupled between said common node and said constant voltage line, said first and second enhancement type amplifying transistors having respective gate electrodes respectively coupled with a monitoring node of said first voltage divider provided between said plurality of first resistors and with a constant voltage node of said second voltage divider provided between said plurality of second resistors, said third enhancement type switching transistor having a gate electrode supplied with a second enable signal turning on with a second enable signal before said internal power voltage level reaches said predetermined reference level.

11. A semiconductor integrated circuit device as set forth in claim 10, in which said first resistors and said second resistors have respective resistances regulated in such a manner that said monitoring node becomes equal in voltage level to said constant voltage node when bias voltage level of said semiconductor substrate is equalized to said constant voltage line.

12. A semiconductor integrated circuit device as set forth in claim 1, in which said semiconductor integrated circuit device is a dynamic random access memory device.

* * * * *